(12) United States Patent
Liu et al.

(10) Patent No.: US 10,109,460 B2
(45) Date of Patent: Oct. 23, 2018

(54) UNIVERSAL NON-INVASIVE CHAMBER IMPEDANCE MEASUREMENT SYSTEM AND ASSOCIATED METHODS

(71) Applicant: Lam Research Corporation, Fremont, CA (US)

(72) Inventors: Chin-Yi Liu, San Jose, CA (US); David Schaefer, Fremont, CA (US); Dan Marohl, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 42 days.

(21) Appl. No.: 15/365,864

(22) Filed: Nov. 30, 2016

(65) Prior Publication Data

US 2018/0151331 A1 May 31, 2018

(51) Int. Cl.
*H01J 37/32* (2006.01)
*H01L 21/26* (2006.01)

(52) U.S. Cl.
CPC .... *H01J 37/32183* (2013.01); *H01J 37/3299* (2013.01); *H01J 37/32155* (2013.01); *H01J 2237/24564* (2013.01); *H01J 2237/327* (2013.01); *H01L 21/26* (2013.01)

(58) Field of Classification Search
None
See application file for complete search history.

(56) References Cited

U.S. PATENT DOCUMENTS

| | | | | |
|---|---|---|---|---|
| 6,887,339 B1 * | 5/2005 | Goodman | ......... | H01J 37/32082 118/723 E |
| 6,920,312 B1 * | 7/2005 | Benjamin | ......... | H01J 37/32082 330/149 |
| 7,691,243 B2 * | 4/2010 | Vukovic | ........... | H01J 37/32477 |
| 7,764,140 B2 * | 7/2010 | Nagarkatti | ................ | H03F 1/56 156/345.28 |
| 8,576,013 B2 * | 11/2013 | Coumou | ................. | H03F 3/191 330/302 |
| 8,710,926 B2 * | 4/2014 | Nagarkatti | ........ | H01J 37/32082 330/254 |
| 8,728,072 B2 * | 5/2014 | Eder | ...................... | A61B 18/14 606/40 |

(Continued)

*Primary Examiner* — Douglas W Owens
*Assistant Examiner* — Srinivas Sathiraju
(74) *Attorney, Agent, or Firm* — Martine Penilla Group, LLP

(57) ABSTRACT

A system is disclosed for measuring an impedance of a plasma processing chamber. The system includes a radiofrequency signal generator configured to output a radiofrequency signal based on a frequency setpoint and provide an indication of an actual frequency of the radiofrequency signal, where the actual frequency can be different than the frequency setpoint. The system includes an impedance control module including at least one variable impedance control device. A difference between the actual frequency of the radiofrequency signal as output by the radiofrequency signal generator and the frequency setpoint is partially dependent upon a setting of the at least one variable impedance control device and is partially dependent upon the impedance of the plasma processing chamber. The system includes a connector configured to connect with a radiofrequency signal supply line of the plasma processing chamber. The impedance control module is connected between the radiofrequency signal generator and the connector.

19 Claims, 9 Drawing Sheets

(56) References Cited

U.S. PATENT DOCUMENTS

| | | | | |
|---|---|---|---|---|
| 8,951,429 B1* | 2/2015 | Liu | .................. | H01J 37/32449 |
| | | | | 216/67 |
| 9,041,471 B2* | 5/2015 | Coumou | ................. | H03F 3/191 |
| | | | | 330/305 |
| 9,065,426 B2* | 6/2015 | Mason | ............... | H01J 37/32183 |
| 9,082,589 B2* | 7/2015 | Thomas | ................ | H01J 37/321 |
| 9,111,722 B2* | 8/2015 | Dorf | ................ | H01J 37/32183 |
| 9,294,100 B2* | 3/2016 | Van Zyl | ............ | H01J 37/32155 |
| 9,295,148 B2* | 3/2016 | Fong | ................ | H01J 37/32091 |
| 9,300,271 B2* | 3/2016 | Matsuno | .................. | H03H 7/40 |
| 9,337,000 B2* | 5/2016 | Marakhtanov | .... | H01J 37/32183 |
| 9,339,323 B2* | 5/2016 | Eder | ................ | A61B 18/1206 |
| 9,368,329 B2* | 6/2016 | Valcore, Jr. | ........ | H01J 37/32146 |
| 9,401,264 B2* | 7/2016 | Marakhtanov | .... | H01J 37/32183 |
| 9,536,713 B2* | 1/2017 | Van Zyl | .............. | H01J 37/3299 |
| 9,620,334 B2* | 4/2017 | Lyndaker | ........... | H01J 37/32183 |
| 9,684,327 B2* | 6/2017 | Fritsch | .............. | H01J 37/32174 |
| 9,711,332 B2* | 7/2017 | Howald | ............ | H01J 37/32183 |
| 2002/0134506 A1* | 9/2002 | Franklin | ........... | H01L 21/67017 |
| | | | | 156/345.31 |
| 2014/0097751 A1* | 4/2014 | Thomas | ................ | H01J 37/321 |
| | | | | 315/111.21 |
| 2014/0159580 A1* | 6/2014 | Fritsch | .............. | H01J 37/32174 |
| | | | | 315/111.21 |
| 2015/0270104 A1* | 9/2015 | Van Zyl | ............ | H01J 37/32183 |
| | | | | 315/111.21 |
| 2015/0348854 A1* | 12/2015 | Kapoor | ............... | H01L 21/0262 |
| | | | | 438/10 |
| 2016/0111259 A1* | 4/2016 | Van Zyl | ................... | H05H 1/46 |
| | | | | 315/111.21 |
| 2016/0268100 A1* | 9/2016 | Valcore, Jr. | ........ | H01J 37/32146 |
| 2016/0307736 A1* | 10/2016 | Howald | ............ | H01J 37/32183 |

\* cited by examiner

| Radiofrequency Signal Generator Setpoint 1 | | |
|---|---|---|
| Impedance Control Module Setpoint 1 | Actual Frequency 1 | Impedance 1 |
| Impedance Control Module Setpoint 2 | Actual Frequency 2 | Impedance 2 |
| ⋮ | ⋮ | ⋮ |
| Impedance Control Module Setpoint N1 | Actual Frequency N1 | Impedance N1 |

| Radiofrequency Signal Generator Setpoint 2 | | |
|---|---|---|
| Impedance Control Module Setpoint 1 | Actual Frequency 1 | Impedance 1 |
| Impedance Control Module Setpoint 2 | Actual Frequency 2 | Impedance 2 |
| ⋮ | ⋮ | ⋮ |
| Impedance Control Module Setpoint N2 | Actual Frequency N2 | Impedance N2 |

⋮

| Radiofrequency Signal Generator Setpoint N4 | | |
|---|---|---|
| Impedance Control Module Setpoint 1 | Actual Frequency 1 | Impedance 1 |
| Impedance Control Module Setpoint 2 | Actual Frequency 2 | Impedance 2 |
| ⋮ | ⋮ | ⋮ |
| Impedance Control Module Setpoint N3 | Actual Frequency N3 | Impedance N3 |

For each of the multiple plasma processing chambers, change one or more settings of the primary matching circuit of the plasma processing chamber to implement the impedance adjustment determined for the plasma processing chamber.

Transmit impedance measurement radiofrequency signal into radiofrequency signal supply line of operating plasma processing chamber, where the impedance measurement radiofrequency signal is separate from other radiofrequency signals used to operate the plasma processing chamber.

703

Determine actual frequency of impedance measurement radiofrequency signal.

705

Determine impedance of operating plasma processing chamber based on determined actual frequency of impedance measurement radiofrequency signal.

Fig. 7

UNIVERSAL NON-INVASIVE CHAMBER IMPEDANCE MEASUREMENT SYSTEM AND ASSOCIATED METHODS

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, and magnitude of the RF power applied, among others. Therefore, it is of interest to understand, monitor, and/or control some of the process parameters that may affect the characteristics of the generated plasma, particularly with regard to delivery of the RF power to the plasma generation region. It is within this context that the present invention arises.

SUMMARY

In an example embodiment, a system is disclosed for measuring an impedance of a plasma processing chamber. The system includes a radiofrequency signal generator configured to output a radiofrequency signal based on a frequency setpoint. The radiofrequency signal generator is configured to provide an indication of an actual frequency of the radiofrequency signal as output by the radiofrequency signal generator. The actual frequency can be different than the frequency setpoint. The system also includes an impedance control module including at least one variable impedance control device. A difference between the actual frequency of the radiofrequency signal as output by the radiofrequency signal generator and the frequency setpoint is partially dependent upon a setting of the at least one variable impedance control device and is partially dependent upon the impedance of the plasma processing chamber. The system also includes a connector configured to connect with a radiofrequency signal supply line of the plasma processing chamber. The impedance control module is connected between the radiofrequency signal generator and the connector.

In an example embodiment, a method is disclosed for measuring an impedance of a plasma processing chamber. The method includes connecting an impedance measurement system to a radiofrequency signal supply line of a plasma processing chamber. The method also includes operating a primary radiofrequency signal generator to transmit one or more radiofrequency signals through a primary matching circuit and through the radiofrequency signal supply line of the plasma processing chamber to generate a plasma within the plasma processing chamber. The method also includes operating the impedance measurement system to generate and transmit a radiofrequency signal based on a frequency setpoint through an impedance control module to the radiofrequency signal supply line of the plasma processing chamber. The impedance measurement system operates separate and independent from the primary radiofrequency signal generator and the primary matching circuit. The impedance measurement system operates to generate and transmit the radiofrequency signal without perturbing generation of the plasma within the plasma processing chamber. The method also includes operating the impedance measurement system to determine an actual frequency of the radiofrequency signal generated and transmitted by the impedance measurement system. The actual frequency can be different than the frequency setpoint. A difference between the actual frequency of the radiofrequency signal as generated by the radiofrequency signal generator and the frequency setpoint is partially dependent upon a setting of the impedance control module and is partially dependent upon the impedance of the plasma processing chamber. The method also includes operating the impedance measurement system to determine an impedance of the plasma processing chamber corresponding to the actual frequency of the radiofrequency signal as generated and transmitted by the impedance measurement system. The determined impedance corresponds to the impedance of the plasma processing chamber during generation of the plasma within the plasma processing chamber.

In an example embodiment, a method is disclosed for matching impedances of multiple plasma processing chambers. The method includes an operation (a) for connecting an impedance measurement system to a radiofrequency signal supply line of a given plasma processing chamber. The method also includes an operation (b) for operating a primary radiofrequency signal generator of the given plasma processing chamber to transmit one or more radiofrequency signals through a primary matching circuit of the given plasma processing chamber and through the radiofrequency signal supply line of the given plasma processing chamber to generate a plasma within the given plasma processing chamber. The method includes an operation (c) for operating the impedance measurement system to generate and transmit a radiofrequency signal based on a frequency setpoint through an impedance control module to the radiofrequency signal supply line of the given plasma processing chamber. The impedance measurement system operates separate and independent from the primary radiofrequency signal generator and the primary matching circuit of the given plasma processing chamber. The method also includes an operation (d) for operating the impedance measurement system to determine an actual frequency of the radiofrequency signal generated and transmitted by the impedance measurement system. The actual frequency can be different than the frequency setpoint. A difference between the actual frequency of the radiofrequency signal as generated by the radiofrequency signal generator and the frequency setpoint is partially dependent upon a setting of the impedance control module and is partially dependent upon the impedance of the given plasma processing chamber. The method also includes an operation (e) for operating the impedance measurement system to determine an impedance of the given plasma processing chamber corresponding to the actual frequency of the radiofrequency signal as generated and transmitted by the impedance measurement system. The determined impedance corresponds to the impedance of the given plasma processing chamber during generation of the plasma within the given plasma processing chamber. The method also includes an operation (f) for performing operations (a) through (e) on multiple plasma processing chambers to determine respective impedances of the multiple plasma processing chambers. The method also includes an operation (g) in which, for each of the multiple plasma processing chambers, a determination is made of a respective impedance adjustment required to bring the determined impedance of the plasma processing chamber into alignment with a target impedance. The method also includes an operation (h) in which, for each of the multiple plasma processing chambers, one or more settings of the primary matching circuit of the plasma processing chamber is changed to implement the impedance adjustment determined for the plasma processing chamber.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 4 shows an example of data that may be queried within the data storage to enable determination of the impedance that corresponds to the actual frequency of the radiofrequency signals transmitted by the radiofrequency signal generator at the current setpoint of the radiofrequency signal generator and the current setpoint of the impedance control module, in accordance with some embodiments of the present invention.

FIG. 6B shows a flowchart of a continuation of the method of FIG. 6A, in accordance with some embodiments of the present invention.

FIG. 7 shows a flowchart of a method for determining an impedance of a plasma processing chamber using the impedance measurement system, in accordance with some embodiments of the present invention.

DETAILED DESCRIPTION

Figure 1:
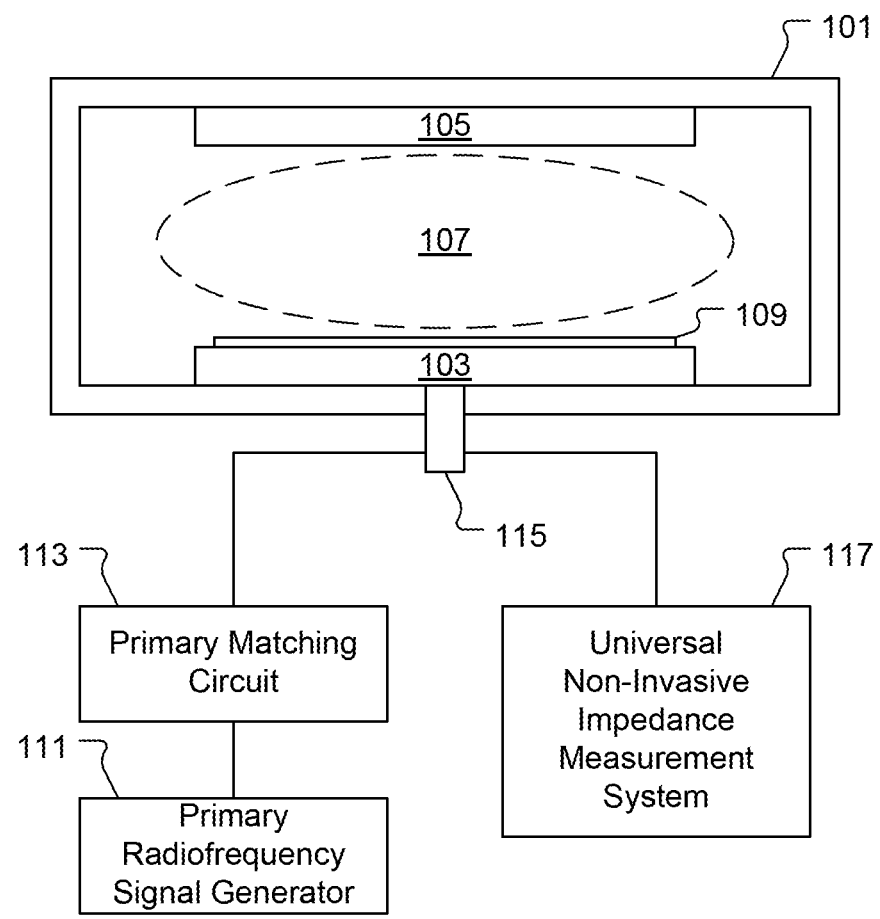
FIG. 1 shows a plasma processing chamber connected to an impedance measurement system, in accordance with some embodiments of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In the semiconductor industry, semiconductor wafers undergo fabrication operations in a multitude of plasma processing chambers. In order to obtain consistent and equivalent fabrication results on the semiconductor wafers it is necessary for the multitude of plasma processing chambers to operate in a substantially equivalent manner in performing a same fabrication operation. Many of the plasma processing chambers operate by applying radiofrequency power to a process gas to generate a plasma in exposure to the semiconductor wafer in order to affect a change in material or surface condition on the semiconductor wafer. Part of ensuring that these plasma processing chambers operate in a substantially equivalent manner in performing a same fabrication operation involves matching of an impedance of the plasma processing chambers as presented to their respective source of the radiofrequency power during actual operation of the plasma processing chambers. It should be appreciated that the impedance of a given plasma processing chamber as presented to its source of radiofrequency power during actual operation of the given plasma processing chamber is affected by many factors, including but not limited to the real-time condition of the plasma being generated in the plasma processing chamber and the real-time condition of the workpiece, e.g., semiconductor wafer, present within the plasma processing chamber.

Impedance matching across multiple plasma processing chambers is a challenge, regardless of the particular type of plasma processing chamber, and especially when the impedance matching is attempted in real-time during plasma generating operations of the multiple plasma processing chambers. One approach for attempting to determine the impedance of a plasma processing chamber during its operation is to insert a Langmuir probe into the plasma inside the plasma processing chamber. However, the invasive nature of the Langmuir probe insertion into the plasma disrupts the plasma process and causes on-wafer process interruption/perturbation. Another approach for attempting to determine the impedance of a plasma processing chamber during its operation is to install a non-invasive V/I probe in the radiofrequency power supply circuit to monitor the voltage, current, and phase angle (between the voltage and current) from the radiofrequency power supply. However, unknown and/or uncharacterized manufacturing variation between different V/I probe units installed on different plasma processing chambers introduces an indeterminate uncertainty of the impedance measurements made on the different plasma processing chambers using the different V/I probe units. Given the foregoing, prior to the present invention, there is no existing equipment or design which can accurately and universally diagnose the impedance of a plasma processing chamber during generation of a plasma within the plasma processing chamber without interrupting and/or perturbing the plasma.

Systems and methods are disclosed herein for measuring the impedance of a plasma processing chamber in real-time and in a non-invasive manner during operation of the plasma processing chamber without interrupting and/or perturbing the plasma generated within the plasma processing chamber. The systems and methods disclosed herein enable measurement of the impedances of multiple plasma processing chambers to enable accurate impedance matching of the multiple plasma processing chambers, without introducing indeterminate uncertainty in the impedance measurements due to unknown and/or uncharacterized equipment manufacturing variation.

FIG. 1 shows a plasma processing chamber 101 connected to an impedance measurement system 117, in accordance with some embodiments of the present invention. It should be understood that the plasma processing chamber 101 can be any type of plasma processing chamber in which radiofrequency signals are applied to a process gas to generate a plasma 107, with the plasma 107 being used to affect a change in a condition of a workpiece 109 in exposure to the plasma 107. In some embodiments, the workpiece 109 is a semiconductor wafer undergoing a fabrication procedure. However, it should be understood that in various embodiments, the workpiece 109 can be essentially any type of substrate that is subjected to a plasma-based fabrication process.

To facilitate description of the present invention, an example of the plasma processing chamber 101 is shown in FIG. 1 in which a support structure 103 is disposed within the plasma processing chamber 101 to support the workpiece 109 in exposure to the plasma 107. In this example of FIG. 1, the support structure 103 is connected to receive radiofrequency power from a primary radiofrequency signal generator 111 by way of a primary matching circuit 113. More specifically, a radiofrequency signal supply line includes a connector 115 to which the primary radiofrequency signal generator 111 is connected by way of the primary matching circuit 113. The primary matching circuit 113 includes an arrangement of capacitors and/or inductors configured to ensure that an impedance seen by the primary radiofrequency signal generator 111 at the radiofrequency signal supply line, e.g., at the connector 115, is sufficiently close to a load impedance for which the primary radiofrequency signal generator 111 is designed to operate, so that radiofrequency signals generated and transmitted by the primary radiofrequency signal generator 111 will be applied to the plasma 107 load in an efficient manner, i.e., without unacceptable reflection.

In some embodiments, the support structure 103 is an electrostatic chuck configured to support and secure the workpiece 109 and serve as an electrode for transmission of the radiofrequency signals from the primary radiofrequency signal generator 111 to the plasma 107. However, in other embodiments, the plasma processing chamber 101 can include other arrangements and configurations of one or more electrodes to provide for transmission of the radiofrequency signals from the primary radiofrequency signal generator 111 to the plasma 107. Also, in some embodiments, the plasma processing chamber 101 can include one or more return electrodes 105 to provide a return path to a reference ground potential for the radiofrequency signals transmitted from the primary radiofrequency signal generator 111 through the plasma 107. And, in some embodiments, one or more structural members of the plasma processing chamber 101, such as walls or the like, can function as return electrodes to provide the return path to the reference ground potential for the radiofrequency signals transmitted from the primary radiofrequency signal generator 111 through the plasma 107. Therefore, in various embodiments, the one or more return electrodes 105 may or may not be present. Overall, it should be understood that the system 117 for measuring the impedance of a plasma processing chamber as disclosed herein can be used with essentially any type of plasma processing chamber in which radiofrequency signals are applied to a process gas to generate a plasma, regardless of the particular configuration of the plasma processing chamber.

In the example of FIG. 1, the impedance measurement system 117 is connected to the radiofrequency signal supply line of the plasma processing chamber 101 at the connector 115. The connector 115 is configured to connect with the radiofrequency signal supply line of the plasma processing chamber 101 at a location between the primary impedance matching circuit 113 of the plasma processing chamber 101 and a primary radiofrequency signal input to the plasma processing chamber 101. In some embodiments, the primary radiofrequency signal input to the plasma processing chamber 101 can be configured as an electrically conductive structure leading directly to an electrode within the plasma processing chamber 101 from which the radiofrequency signals are transmitted to generated the plasma 107. In some embodiments, the connector 115 is a configured as a passive terminal on the radiofrequency signal supply line. For example, in some embodiments the radiofrequency signal supply line entering the plasma processing chamber 101 can be configured as a electrically conductive rod, and in these embodiments the connector 115 can be configured as a fitting, e.g., T-shaped fitting, that provides a terminal for connection of a conductive line, such as a coaxial cable or the like, leading to the impedance measurement system 117. Also, in some embodiments, the impedance measurement system 117 can be connected to the plasma processing chamber 101 through an extant device, such as through a V/I probe already connected to the radiofrequency signal supply line of the plasma processing chamber 101. However, it is of interest to connect the impedance measurement system 117 to the plasma processing chamber at a location on the radiofrequency signal supply line that exhibits substantially the same load impedance as seen by the combination of the primary radiofrequency signal generator 111 and primary matching circuit 113.

The impedance measurement system 117 is configured to determine the true impedance of the plasma processing chamber 101 while the plasma 107 is being generated within the plasma processing chamber 101, and without interrupting and/or perturbing the plasma 107. The impedance measurement system 117 is universal in the sense that it can be used on any type of plasma processing chamber. And, the impedance measurement system 117 is non-invasive in the sense that it can measure the impedance of the plasma processing chamber 101, i.e., the impedance seen by the combination of the primary radiofrequency signal generator 111 and the primary matching circuit 113, in real-time while the plasma processing chamber 101 is operating without interrupting and/or perturbing the plasma 107 within the plasma processing chamber 101.

Figure 2:
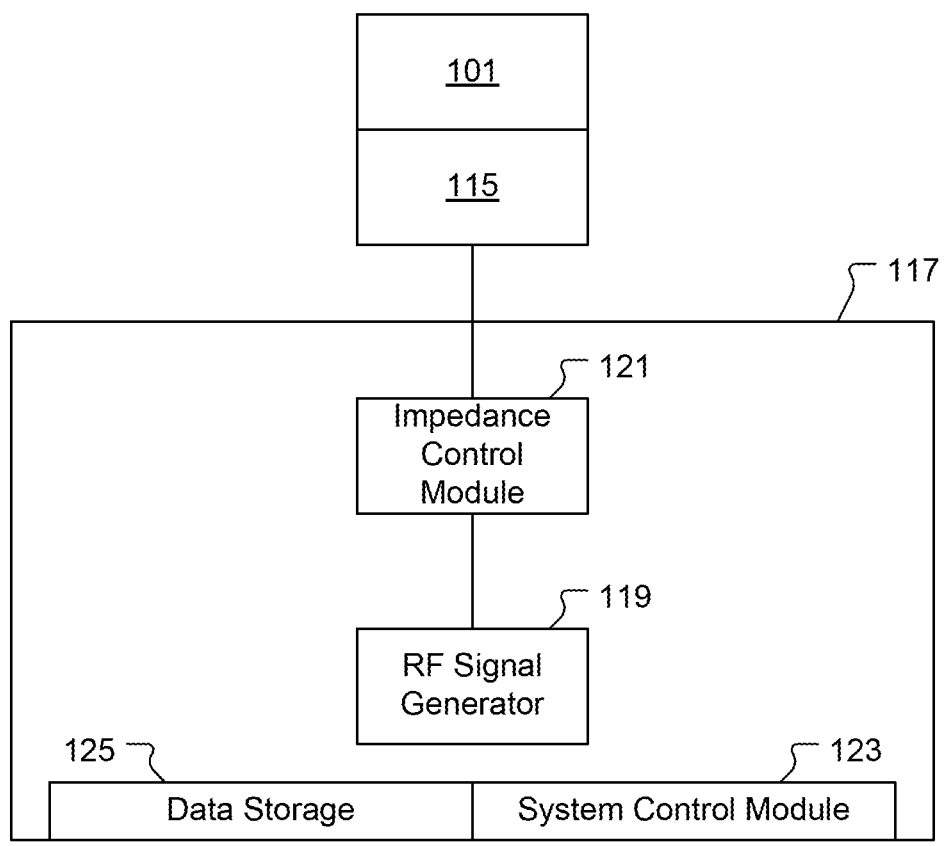
FIG. 2 shows a configuration of the impedance measurement system, in accordance with some embodiments of the present invention.

FIG. 2 shows a configuration of the impedance measurement system 117, in accordance with some embodiments of the present invention. The impedance measurement system 117 includes a radiofrequency signal generator 119 and an impedance control module 121. The radiofrequency signal generator 119 is configured to output a radiofrequency signal based on a frequency setpoint. The radiofrequency signal generator 119 is configured to provide an indication of an actual frequency of the radiofrequency signal as output by the radiofrequency signal generator 119. The actual frequency of the radiofrequency signals can differ from the frequency setpoint. The radiofrequency signal generator 119 is separate and independent from the primary radiofrequency signal generator 111 used to generate the plasma 107 within the plasma processing chamber 101. The radiofrequency signal generator 119 is a radiofrequency signal frequency tuning generator configured to generate and transmit radiofrequency signals based on the frequency setpoint and a power setpoint, with the radiofrequency signal generator 119 operating to adjust its frequency based on an impedance of the load presented to the radiofrequency signal generator 119 to optimize transmission of the radiofrequency signals to the load.

In some embodiments, the radiofrequency signal generator 119 is operated at a power within a range extending from about 5 Watts (W) to about 1000 W. In some embodiments, the radiofrequency signal generator 119 is operated at a power within a range extending from about 5 W to about 500 W. In some embodiments, the radiofrequency signal generator 119 is operated at a power within a range extending from about 10 W to about 200 W. In some embodiments, the radiofrequency signal generator 119 is operated at a power of about 10 W. And, in other embodiments, the radiofrequency signal generator 119 can be operated at a power other than those mentioned above. It should be appreciated that the power input to the plasma processing chamber 101 by the radiofrequency signal generator 119 does not significantly perturb the plasma 107 generated within the plasma processing chamber 101. A low end of radiofrequency signal generator 119 power range is set by the power needed to obtain a clear frequency response signal due to changes in the setpoint of the impedance control module 121 within impedance measurement system 117. Also, in various embodiments, the radiofrequency signal generator 119 can be operated at different frequencies, such as 27 megaHertz (MHz) or 60 MHz, or essentially any other frequency. Operation of the radiofrequency signal generator 119 at a higher frequency setpoint provides for increased sensitivity with regard to detecting changes in frequency response.

As previously mentioned, the connector 115 is configured to connect with the radiofrequency signal supply line of the plasma processing chamber 101. The impedance control module 121 is connected between the radiofrequency signal generator 119 and the connector 115. The impedance control module 121 can include at least one variable impedance control device. A difference between the actual frequency of the radiofrequency signal as output by the radiofrequency signal generator 119 and the frequency setpoint is partially dependent upon a setting of the at least one variable impedance control device within the impedance control module 121, and is partially dependent upon the impedance of the plasma processing chamber 101. The impedance control module 121 is separate and independent from a primary impedance matching circuit 113 of the plasma processing chamber 101. In various embodiments, the at least one variable impedance control device of the impedance control module 121 includes at least one variable capacitor, or at least one variable inductor, or both at least one variable capacitor and at least one variable inductor. Also, in some embodiments, the impedance control module 121 includes at least one motor and corresponding linkage for respectively controlling the at least one variable impedance control device. In some embodiments, the impedance control module 121 includes a combination of capacitors and/or inductors in various serial and parallel relationships with respect to each other to provide control of the impedance seen by the radiofrequency signal generator 119 in transmitting radiofrequency signals to the plasma processing chamber 101.

The actual frequency of the generated and transmitted radiofrequency signals will adjust to reach a minimum reflected power for a given load impedance, i.e., for a given impedance of the operating plasma processing chamber.

Because the impedance of the operating plasma processing chamber 101 can change in real-time during operation, the actual frequency of the generated and transmitted radiofrequency signals can correspondingly adjust in real-time to the changing impedance of the operating plasma processing chamber 101. For example, for a given set of impedance matching parameters and a given frequency setpoint, with a silicon wafer being processed in the plasma processing chamber 101, the actual frequency of the radiofrequency signals may be 27.2 MHz (megaHertz). However, for the same given set of impedance matching parameters and the same given frequency setpoint, but with an oxide material deposited on the wafer, the actual frequency of the radiofrequency signals may be 26.5 MHz. Therefore, it should be appreciated that the impedance of the plasma processing chamber can change in real-time due to changes that occur on the workpiece 109.

The impedance measurement system 117 also includes a system control module 123 configured to provide for control of the at least one variable impedance control device of the impedance control module 121. The system control module 123 is also configured to provide for control of the radiofrequency signal generator 119. For example, the system control module 123 can provide a computer interface through which an operator of the impedance measurement system 117 can control the frequency setpoint and power setpoint of the radiofrequency signal generator 119.

The radiofrequency signal generator 119 is configured to communicate the actual frequency of the radiofrequency signals, as generated and transmitted by the radiofrequency signal generator 119, to the system control module 123. The system control module 123 is configured to determine and output an impedance value corresponding to the actual frequency indication as provided by the radiofrequency signal generator 119.

The impedance measurement system 117 also includes a data storage 125 including impedance values for different combinations of actual frequency indication and settings of the at least one variable impedance control device within the impedance control module 121. The data storage is accessible by the system control module 123 to support determination of the impedance value corresponding to the actual frequency indication provided by the radiofrequency signal generator 119. In various embodiments, the data storage 125 can include one or more databases or other types of data management systems to support determination of the impedance value corresponding to the actual frequency indication provided by the radiofrequency signal generator 119. In some embodiments, the data storage 125 includes lookup tables of impedance as a function of actual frequency of the radiofrequency signals generated and transmitted by the radiofrequency signal generator 119, for different setpoints of the impedance control module 121 and radiofrequency signal generator 119. In these embodiments, the system control module 123 can access and query these lookup tables to determine the real-time impedance value for the operating plasma processing chamber 101 based on the determined actual frequency of the radiofrequency signals generated and transmitted by the radiofrequency signal generator 119. In various embodiments, the system control module 123 is configured to display the determined impedance of the plasma processing chamber 101 to enable chamber-to-chamber impedance matching by an operator of the plasma processing chamber 101.

Figure 3:
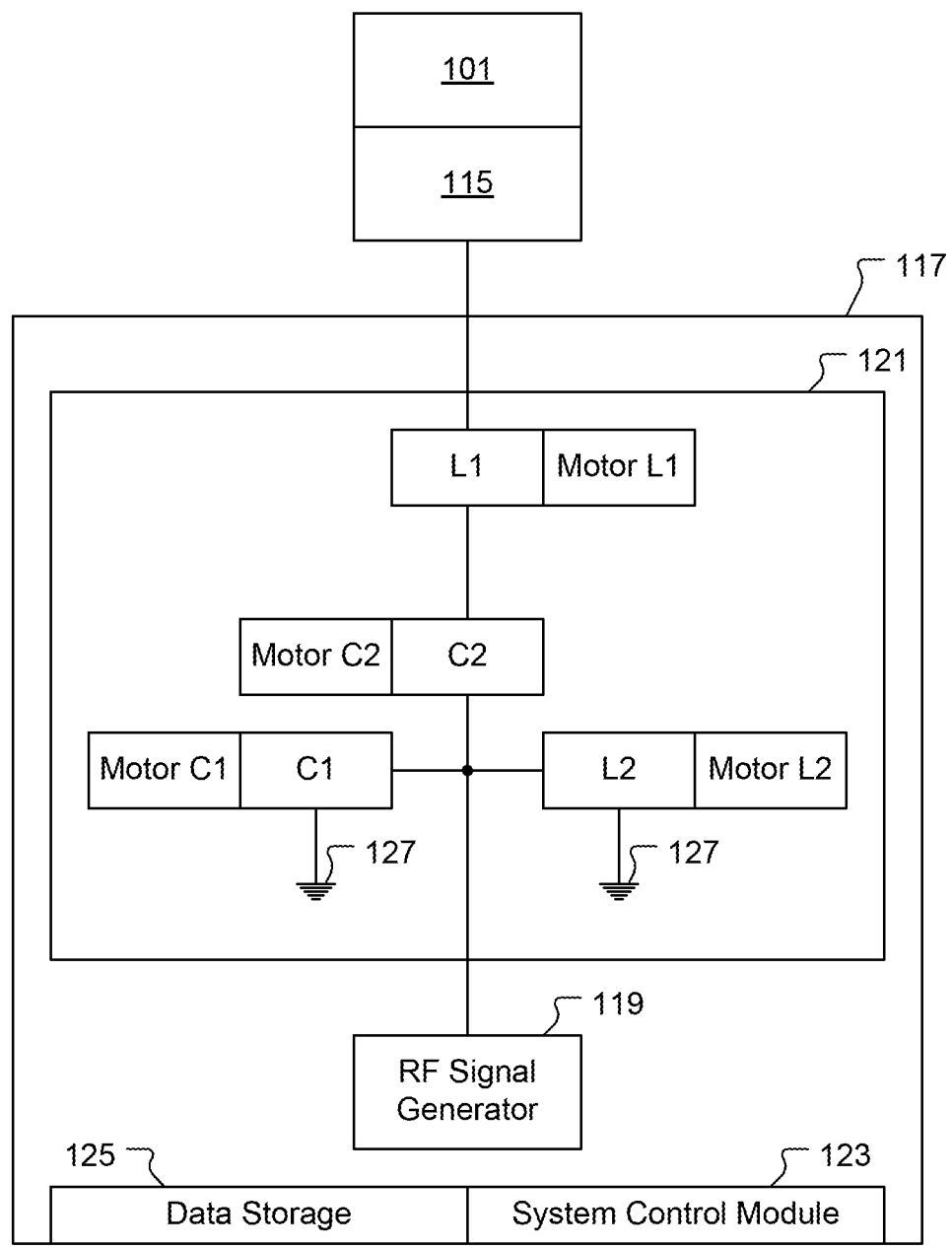
FIG. 3 shows the impedance measurement system with an example configuration of the impedance control module, in accordance with some embodiments of the present invention.

FIG. 3 shows the impedance measurement system 117 with an example configuration of the impedance control module 121, in accordance with some embodiments of the present invention. In the example embodiment, the impedance control module 121 includes variable capacitors C1 and C2 and variable inductors L1 and L2. The variable capacitors C1 and C2 are controlled by respective motors, namely Motor C1 and Motor C2. And, the variable inductors L1 and L2 are controlled by respective motors, namely Motor L1 and Motor L2. The system control module 123 can be connected to the different motors of the variable capacitors C1, C2 and variable inductors L1, L2 to control the respective motor positions and correspondingly control the settings of the variable capacitors C1, C2 and variable inductors L1, L2. In the example embodiment of FIG. 3, a given setting combination of the variable capacitors C1, C2 and variable inductors L1, L2 defines a setpoint of the impedance control module 121. More generally, in other embodiments, a given combination of settings of whatever capacitors and inductors are present within the impedance control module 121 defines a setpoint of the impedance control module 121.

In the example embodiment of FIG. 3, the variable capacitor C2 and the variable inductor L1 are electrically connected in a serial manner between the output of the radiofrequency signal generator 119 and the connector 115. The variable capacitor C2 and variable inductor L1 collectively act as blocking device to prevent radiofrequency signals from the primary radiofrequency signal generator 111 entering the radiofrequency signal generator 119. The variable capacitor C2 and the variable inductor L1 can be adjusted by way of their respective motors (Motor C2 and Motor L1) under the control of the system control module 123 to adjust an impedance seen by the radiofrequency signal generator 119. Each of the variable capacitor C1 and the variable inductor L2 is electrically connected between the output of the radiofrequency signal generator 119 and a reference ground potential 127. The variable capacitor C1 and the variable inductor L2 can be adjusted by way of their respective motors (Motor C1 and Motor L2) under the control of the system control module 123 to adjust an admittance seen by the radiofrequency signal generator 119. Also, the variable capacitors C1, C2, and the variable inductors L1, L2 can be adjusted by way of their respective motors under the control of the system control module 123 to control a frequency position and a reflected power of the radiofrequency signal generator 119. It should be understood that the configuration of capacitors C1, C2 and inductors L1, L2 as shown in FIG. 3 represents an example of how the impedance control module 121 can be configured. In other embodiments, the impedance control module 121 can be configured to include essentially any number and connective arrangement of capacitors and inductors as needed to obtain an acceptable impedance/admittance control capability. Also, in various embodiments, any of the capacitors and/or inductors present within the impedance control module 121 can be variable or fixed as needed to obtain an acceptable impedance/admittance control capability.

The impedance measurement system 117 is connected to the radiofrequency supply line of the plasma processing chamber 101 by way of the connector 115. The plasma processing chamber 101 is operated to generate the plasma 107 in accordance with a measurement recipe, which can include a specification of operational parameters such as process gas type, process gas flow rate, pressure, temperature, primary radiofrequency signal generator 111 setpoint (frequency and power), primary matching circuit 113 setpoint, and essentially any other operational parameter associated with plasma processing chamber 101. Also, in some embodiments, the workpiece 109 can be present in the plasma processing chamber 101 during generation of the plasma 107 in accordance with the measurement recipe. And, in some embodiments, the measurement recipe can be defined in a manner that allows for generation of the plasma 107 in the absence of the workpiece 109 so as to avoid damaging the support structure 103.

With the plasma processing chamber 101 operating to generate the plasma 107 in accordance with a measurement recipe, the impedance measurement system 117 is operated to generate and transmit radiofrequency signals from the radiofrequency signal generator 119 through the impedance control module 121 through the connector 115 to the plasma processing chamber 101, in accordance with a given setpoint of the radiofrequency signal generator 119 (setpoint frequency and setpoint power) and in accordance with a given setpoint of the impedance control module 121. The radiofrequency signal generator 119 operates to tune the frequency of the radiofrequency signals that it generates and transmits based on an impedance of the load seen by the radiofrequency signal generator 119 so as to arrive at an actual frequency of the radiofrequency signals transmitted by the radiofrequency signal generator 119. The radiofrequency signal generator 119 is configured to convey the determined actual frequency of the radiofrequency signals transmitted by the radiofrequency signal generator 119 to the system control module 123. The system control module 123 then operates to query the data storage 125 to determine an impedance that corresponds to the actual frequency of the radiofrequency signals transmitted by the radiofrequency signal generator 119 at the current setpoint of the radiofrequency signal generator 119 and the current setpoint of the impedance control module 121.

FIG. 4 shows an example of data that may be queried within the data storage 125 to enable determination of the impedance that corresponds to the actual frequency of the radiofrequency signals transmitted by the radiofrequency signal generator 119 at the current setpoint of the radiofrequency signal generator 119 and the current setpoint of the impedance control module 121, in accordance with some embodiments of the present invention. FIG. 4 shows impedance values tabulated for different combinations of actual frequency and impedance control module 121 setpoint and radiofrequency signal generator 119 setpoint. It should be understood that the particular data arrangement depicted in FIG. 4 is one or many possible data arrangements, so long as the data arrangement provides for determination of the impedance corresponding to a specific combination of actual frequency, impedance control module 121 setpoint, and radiofrequency signal generator 119 setpoint. Also, it should be understood that the various impedances for the different combinations of actual frequency, impedance control module 121 setpoint, and radiofrequency signal generator 119 setpoint as recorded in the data storage 125 can be determined empirically by connecting the impedance measurement system 117 to known impedances and operating the impedance measurement system 117 through various combinations of impedance control module 121 setpoints and radiofrequency signal generator 119 setpoints.

Once the impedance measurement system 117 determines and conveys the impedance of the operating plasma processing chamber 101, an operator can adjust one or more parameters of the plasma processing chamber 101 as needed to obtain a desired result, such as matching chamber-to-chamber impedances. The impedance measurement system 117 can operate to determine the impedance difference for a given operating plasma processing chamber 101 relative to a target impedance value in real-time without perturbing the normal operation of the plasma processing chamber 101, i.e., without perturbing the plasma 107 generated in the plasma processing chamber 101. Then, the operator of the plasma processing chamber 101 can adjust one or more parameters of the plasma processing chamber 101 and/or process recipe parameters as needed to overcome, mitigate, and/or eliminate the determined impedance difference quickly and accurately. Also, the impedance measurement system 117 provides for real-time monitoring of the actual impedance of the operating plasma processing chamber 101 as the plasma processing chamber 101 impedance is adjusted to an impedance value needed for chamber-to-chamber impedance matching.

Figure 5A:
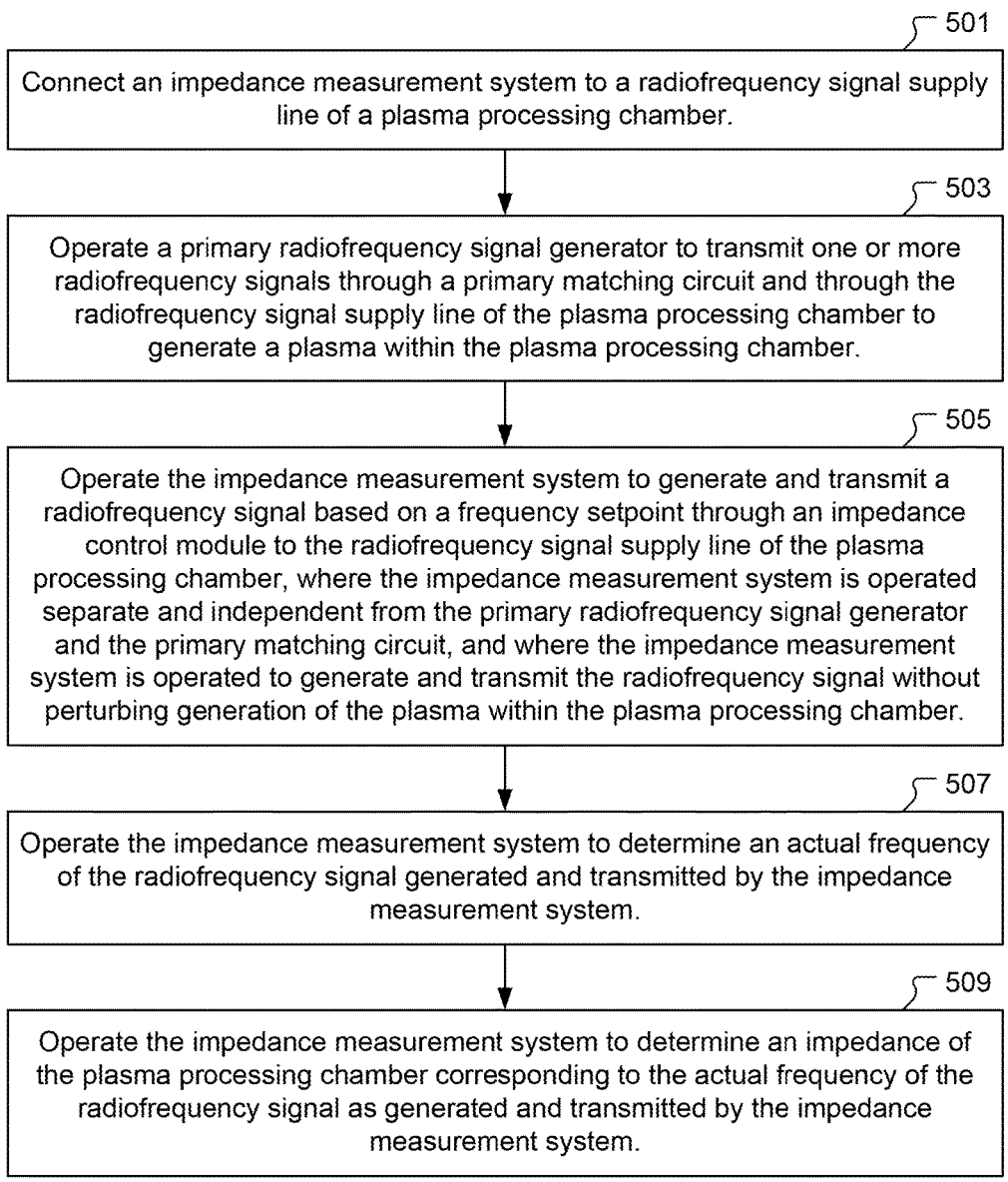
FIG. 5A shows a flowchart of a method for measuring an impedance of the plasma processing chamber using the impedance measurement system, in accordance with some embodiments of the present invention.

FIG. 5A shows a flowchart of a method for measuring an impedance of the plasma processing chamber 101 using the impedance measurement system 117, in accordance with some embodiments of the present invention. The method includes an operation 501 for connecting the impedance measurement system 117 to the radiofrequency signal supply line of the plasma processing chamber 101. The method also includes operating the primary radiofrequency signal generator 111 to transmit one or more radiofrequency signals through the primary matching circuit 113 and through the radiofrequency signal supply line of the plasma processing chamber 101 to generate the plasma 107 within the plasma processing chamber 101.

The method also includes an operation 505 for operating the impedance measurement system 117 to generate and transmit a radiofrequency signal based on a frequency setpoint through the impedance control module 121 (having a prescribed setpoint) to the radiofrequency signal supply line of the plasma processing chamber 101. The impedance measurement system 117 operates separate and independent from the primary radiofrequency signal generator 111 and the primary matching circuit 113. The impedance measurement system 117 operates to generate and transmit the radiofrequency signal without perturbing generation of the plasma 107 within the plasma processing chamber 101. In some embodiments, the frequency setpoint is within a range extending from about 2 MHz to about 100 MHz. In some embodiments, a power of the radiofrequency signal as generated and transmitted by the impedance measurement system 117 is within a range extending from about 5 W to about 1000 W.

The method also includes an operation 507 for operating the impedance measurement system 117 to determine an actual frequency of the radiofrequency signal generated and transmitted by the impedance measurement system 117. The actual frequency can be different than the frequency setpoint of the radiofrequency signal generator 119. A difference between the actual frequency of the radiofrequency signal as generated by the radiofrequency signal generator 119 and the frequency setpoint is partially dependent upon a setting of the impedance control module 121 and is partially dependent upon the impedance of the plasma processing chamber 101. The method also includes an operation 509 for operating the impedance measurement system 117 to determine an impedance of the plasma processing chamber 101 corresponding to the actual frequency of the radiofrequency signal as generated and transmitted by the impedance measurement system 117. The determined impedance corresponds to the impedance of the plasma processing chamber 101 during generation of the plasma 107 within the plasma processing chamber 101.

The method of FIG. 5A can also include setting at least one variable impedance control device within the impedance control module 121 to a prescribed setpoint, and maintaining the prescribed setpoint while operating the impedance measurement system 117 to generate and transmit the radiofrequency signal based on the frequency setpoint. The method of FIG. 5A can also include accessing the data storage 125 to determine the impedance corresponding to the actual frequency of the radiofrequency signal generated and transmitted by the impedance measurement system 117. The data storage 125, i.e., the data stored therein, provides a correlation between the actual frequency of the radiofrequency signal generated and transmitted by the impedance measurement system 117 and impedance as a function of the prescribed setpoint. In some embodiments, the at least one variable impedance control device includes at least one variable capacitor, or at least one variable inductor, or both at least one variable capacitor and at least one variable inductor. Also, in some embodiments, the prescribed setpoint is defined by a combination of respective capacitance settings of the at least one variable capacitor when present within the impedance control module 121 and respective inductance settings of the at least one variable inductor when present within the impedance control module 121.

The method of FIG. 5A can also include operating the system control module 123 of the impedance measurement system 117 to set the at least one variable impedance control device within the impedance control module 121 to the prescribed setpoint. The method of FIG. 5A can also include operating the system control module 123 of the impedance measurement system 117 to direct generation and transmission of the radiofrequency signal based on the frequency setpoint by the radiofrequency signal generator 119. Also, the method of FIG. 5A can include operating the system control module 123 of the impedance measurement system 117 to convey the determined impedance corresponding to the impedance of the plasma processing chamber 101 during generation of the plasma 107 within the plasma processing chamber 101, such as by displaying the determined impedance on a computer display.

Figure 5B:
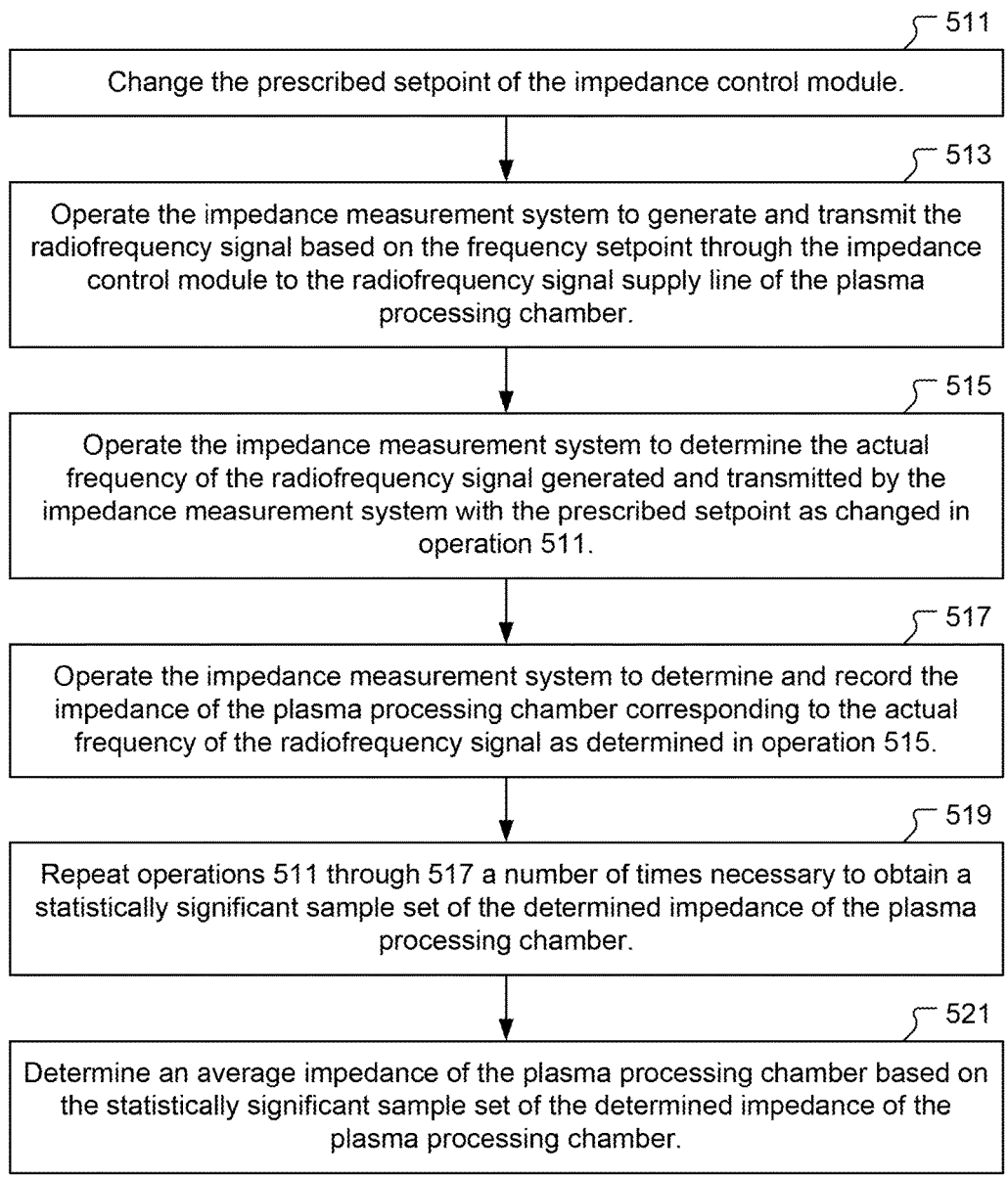
FIG. 5B shows a flowchart of a continuation of the method of FIG. 5A, in accordance with some embodiments of the present invention.

FIG. 5B shows a flowchart of a continuation of the method of FIG. 5A, in accordance with some embodiments of the present invention. The method includes an operation 511 for changing the prescribed setpoint of the impedance control module 121. The method also includes an operation 513 for operating the impedance measurement system 117 to generate and transmit the radiofrequency signal based on the frequency setpoint through the impedance control module 121 to the radiofrequency signal supply line of the plasma processing chamber 101. The method also includes an operation 515 for operating the impedance measurement system 117 to determine the actual frequency of the radiofrequency signal generated and transmitted by the impedance measurement system 117 at the prescribed setpoint as changed in operation 511. The method also includes an operation 517 for operating the impedance measurement system 117 to determine and record the impedance of the plasma processing chamber 101 corresponding to the actual frequency of the radiofrequency signal as determined in operation 515. The method also includes an operation 519 for repeating operations 511 through 517 a number of times necessary to obtain a statistically significant sample set of the determined impedance of the plasma processing chamber 101. The method also includes an operation 521 for determining an average impedance of the plasma processing chamber 101 based on the statistically significant sample set of the determined impedance of the plasma processing chamber 101. The method can also include determining a standard deviation of the average impedance of the plasma processing chamber 101 based on the statistically significant sample set of the determined impedance of the plasma processing chamber 101. In this manner, the impedance measurement system 117 allows for use of multiple impedance matching setpoints of the impedance control module 121 to enable crosspoint checking of the true impedance of the plasma processing chamber 101.

Figure 5C:
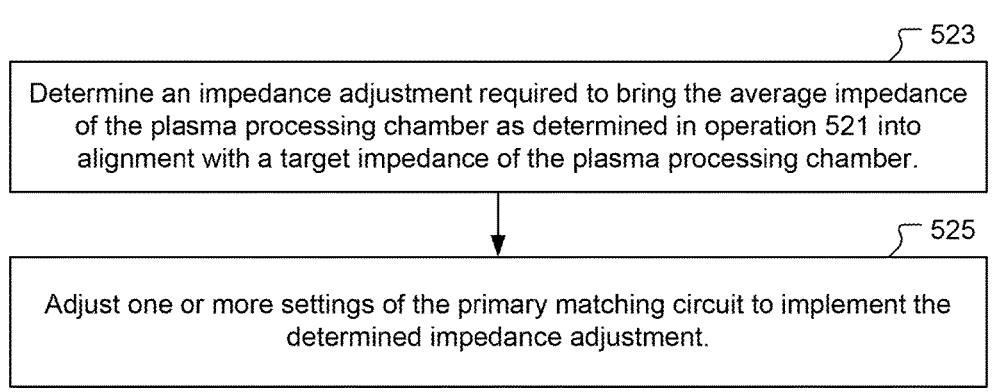
FIG. 5C shows a flowchart of a continuation of the method of FIG. 5B, in accordance with some embodiments of the present invention.

FIG. 5C shows a flowchart of a continuation of the method of FIG. 5B, in accordance with some embodiments of the present invention. The method includes an operation 523 for determining an impedance adjustment required to bring the average impedance of the plasma processing chamber 101 as determined in operation 521 into alignment with a target impedance of the plasma processing chamber 101. In some embodiments, the method can also include an operation 525 for adjusting one or more settings of the primary matching circuit 113 to implement the determined impedance adjustment.

Figure 6A:
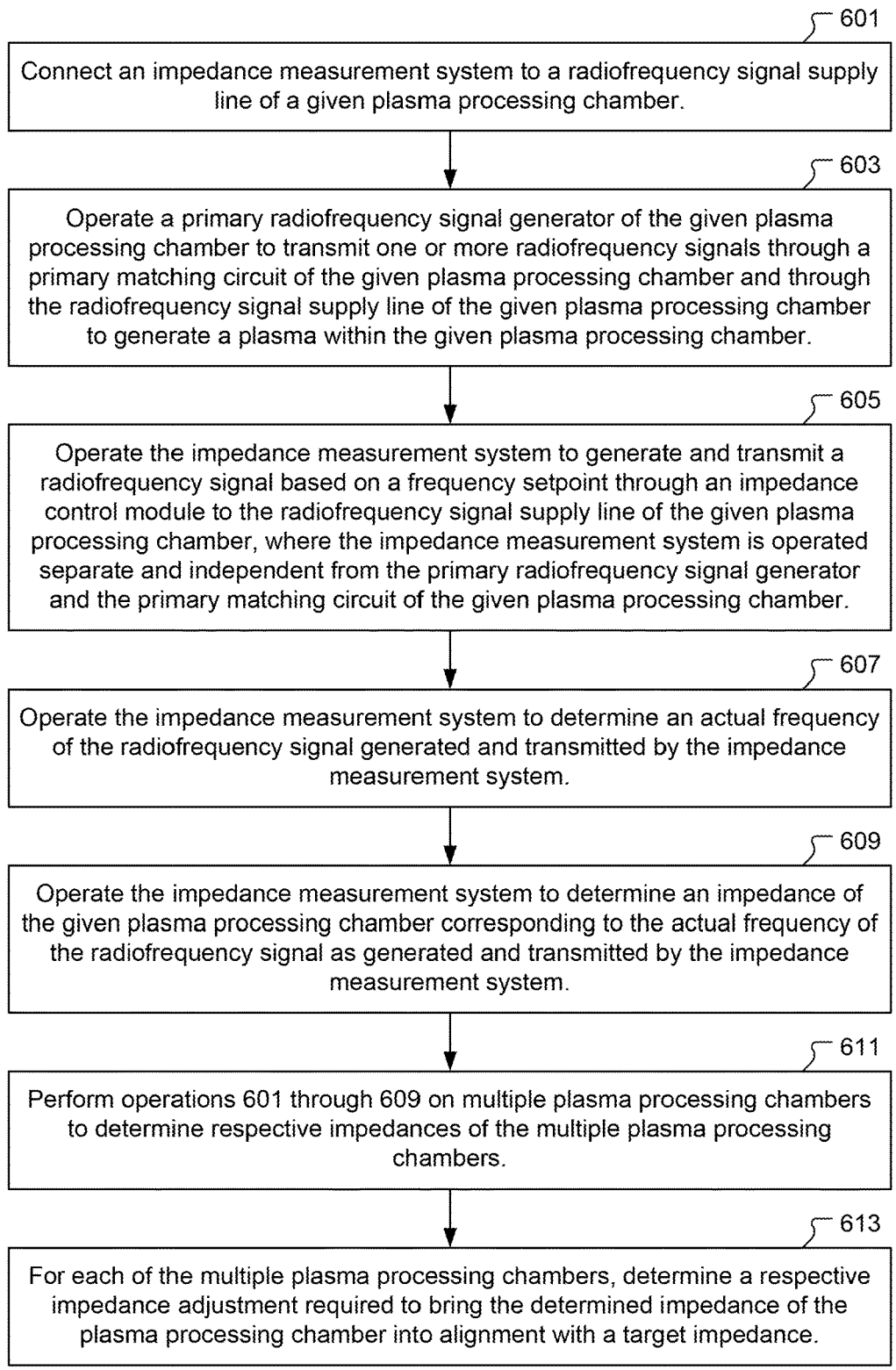
FIG. 6A shows a flowchart of a method for matching impedances of multiple plasma processing chambers using the impedance measurement system, in accordance with some embodiments of the present invention.

FIG. 6A shows a flowchart of a method for matching impedances of multiple plasma processing chambers 101 using the impedance measurement system 117, in accordance with some embodiments of the present invention. The method includes an operation 601 for connecting the impedance measurement system 117 to a radiofrequency signal supply line of a given plasma processing chamber. The method also includes an operation 603 for operating the primary radiofrequency signal generator 111 of the given plasma processing chamber, e.g., 101, to transmit one or more radiofrequency signals through the primary matching circuit 113 of the given plasma processing chamber and through the radiofrequency signal supply line of the given plasma processing chamber to generate the plasma 107 within the given plasma processing chamber 101.

The method also includes an operation 605 for operating the impedance measurement system 117 to generate and transmit a radiofrequency signal based on a frequency setpoint through the impedance control module 121 to the radiofrequency signal supply line of the given plasma processing chamber. The impedance measurement system 117 operates separate and independent from the primary radiofrequency signal generator 111 and the primary matching circuit 113 of the given plasma processing chamber.

The method also includes an operation 607 for operating the impedance measurement system 117 to determine an actual frequency of the radiofrequency signal generated and transmitted by the impedance measurement system 117. The actual frequency can be different than the frequency setpoint. A difference between the actual frequency of the radiofrequency signal as generated by the radiofrequency signal generator 119 and the frequency setpoint is partially dependent upon a setting of the impedance control module 121 and is partially dependent upon the impedance of the given plasma processing chamber.

The method also includes an operation 609 for operating the impedance measurement system 117 to determine an impedance of the given plasma processing chamber corresponding to the actual frequency of the radiofrequency signal as generated and transmitted by the impedance measurement system 117. The determined impedance corresponds to the impedance of the given plasma processing chamber during generation of the plasma within the given plasma processing chamber. The method also includes an operation 611 for performing operations 601 through 609 on multiple plasma processing chambers to determine respective impedances of the multiple plasma processing chambers.

The method also includes an operation 613 for determining a respective impedance adjustment required to bring the determined impedance of each of the multiple plasma processing chambers into alignment with a target impedance. In some embodiments, the target impedance is set equal to the determined impedance of one of the multiple plasma processing chambers. In some embodiments, the target impedance is set to a value different than any of the determined impedances of the multiple plasma processing chambers.

It should be understood that the impedance of plasma processing chambers varies from chamber to chamber due to manufacturing variation in components that make up the chambers. It is often necessary to adjust the impedance of different plasma processing chambers in order to achieve the same results on the workpieces processed in the different plasma processing chambers. Operation of the impedance measurement system 117 in accordance with the method of FIG. 6A enables determination of how much impedance difference exists between different plasma processing chambers so that the operators of the different plasma processing chambers can make whatever adjustments are needed to align the impedances of the different plasma processing chambers. Use of the same impedance measurement system 117 to measure the impedance of different plasma processing chambers eliminates the chamber-to-chamber variation in impedance measurement that could occur with use of different V/I probe units on different plasma processing chambers due to manufacturing variations between the different V/I probe units. Also, because the same impedance measurement system 117 is used on the different plasma processing chambers that are to be aligned in impedance, the influence of the impedance measurement system 117 on the measured chamber impedances will be the same for the different plasma processing chambers, and thereby cancel out when comparing measured chamber-to-chamber impedances.

In some embodiments, for each of the multiple plasma processing chambers, the method of FIG. 6A can also include repeating operations 605 through 609 for each of multiple prescribed setpoints of the impedance control module 121 to determine a statistically significant sample set of impedance values for the plasma processing chamber. Also, for each of the multiple plasma processing chambers, the method of FIG. 6A can include determining an average impedance of the plasma processing chamber based on the statistically significant sample set of impedance values determined for the plasma processing chamber. And, for each of the multiple plasma processing chambers, the method of FIG. 6A can include using the average impedance of the plasma processing chamber as the determined impedance of the plasma processing chamber in operation 613. FIG. 6B shows a flowchart of a continuation of the method of FIG. 6A, in accordance with some embodiments of the present invention. The method includes an operation 615 in which, for each of the multiple plasma processing chambers, one or more settings of the primary matching circuit 113 of the plasma processing chamber is/are changed to implement the impedance adjustment determined for the plasma processing chamber in operation 613.

FIG. 7 shows a flowchart of a method for determining an impedance of a plasma processing chamber using the impedance measurement system 117, in accordance with some embodiments of the present invention. The method includes an operation 701 for transmitting an impedance measurement radiofrequency signal into a radiofrequency signal supply line of the plasma processing chamber while the plasma processing chamber is operating. The impedance measurement radiofrequency signal is separate from other radiofrequency signals used to operate the plasma processing chamber. The method also includes an operation 703 for determining an actual frequency of the impedance measurement radiofrequency signal. The method also includes an operation 705 for determining an impedance of the operating plasma processing chamber based on the determined actual frequency of the impedance measurement radiofrequency signal.

It should be understood that the impedance measurement system 117 provides its own radiofrequency signals to the plasma processing chamber 101 at the same time the plasma processing chamber 101 is operating in conjunction with a separate and independent primary radiofrequency signal generator 111 and in conjunction with a separate and independent primary matching circuit 113. It should be understood that the impedance measurement system 117 disclosed herein enables chamber-to-chamber impedance matching accurately and quickly without plasma disruption. Also, it should be understood that the impedance measurement system 117 disclosed herein can be utilized with essentially any type of plasma processing chamber.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A system for measuring an impedance of a plasma processing chamber, comprising:
  a radiofrequency signal generator configured to output a radiofrequency signal based on a frequency setpoint, the radiofrequency signal generator configured to provide an indication of an actual frequency of the radiofrequency signal as output by the radiofrequency signal generator, wherein the actual frequency can be different than the frequency setpoint, wherein the radiofrequency signal generator is separate and independent from a primary radiofrequency signal generator used to generate a plasma within the plasma processing chamber;
  an impedance control module including at least one variable impedance control device, wherein a difference between the actual frequency of the radiofrequency signal as output by the radiofrequency signal generator and the frequency setpoint is partially dependent upon a setting of the at least one variable impedance control device and is partially dependent upon the impedance of the plasma processing chamber; and
  a connector configured to connect with a radiofrequency signal supply line of the plasma processing chamber, the impedance control module connected between the radiofrequency signal generator and the connector.

2. The system as recited in claim 1, wherein the impedance control module is separate and independent from a primary impedance matching circuit of the plasma processing chamber.

3. The system as recited in claim 2, wherein the connector is configured to connect with the radiofrequency signal supply line of the plasma processing chamber at a location between the primary impedance matching circuit of the plasma processing chamber and a primary radiofrequency signal input to the plasma processing chamber.

4. The system as recited in claim 1, wherein the at least one variable impedance control device includes at least one variable capacitor, or at least one variable inductor, or both at least one variable capacitor and at least one variable inductor.

5. The system as recited in claim 4, further comprising: at least one motor and corresponding linkage for respectively controlling the at least one variable impedance control device.

6. The system as recited in claim 1, further comprising: a system control module configured to provide for control of the at least one variable impedance control device of the impedance control module, the system control module configured to provide for control of the radiofrequency signal generator.

7. The system as recited in claim 6, wherein the system control module is configured to determine and output an impedance value corresponding to the actual frequency indication provided by the radiofrequency signal generator.

8. The system as recited in claim 7, further comprising: a data storage including impedance values for different combinations of actual frequency indication and settings of the at least one variable impedance control device, wherein the data storage is accessible by the system control module to support determination of the impedance value corresponding to the actual frequency indication provided by the radiofrequency signal generator.

9. A method for measuring an impedance of a plasma processing chamber, comprising:
  connecting an impedance measurement system to a radiofrequency signal supply line of a plasma processing chamber;
  operating a primary radiofrequency signal generator to transmit one or more radiofrequency signals through a primary matching circuit and through the radiofrequency signal supply line of the plasma processing chamber to generate a plasma within the plasma processing chamber;
  operating the impedance measurement system to generate and transmit a radiofrequency signal based on a frequency setpoint through an impedance control module to the radiofrequency signal supply line of the plasma processing chamber, the impedance measurement system operating separate and independent from the primary radiofrequency signal generator and the primary matching circuit, the impedance measurement system operating to generate and transmit the radiofrequency signal without perturbing generation of the plasma within the plasma processing chamber;
  operating the impedance measurement system to determine an actual frequency of the radiofrequency signal generated and transmitted by the impedance measurement system, wherein the actual frequency can be different than the frequency setpoint, wherein a difference between the actual frequency of the radiofrequency signal as generated by the radiofrequency signal generator and the frequency setpoint is partially dependent upon a setting of the impedance control module and is partially dependent upon the impedance of the plasma processing chamber; and
  operating the impedance measurement system to determine an impedance of the plasma processing chamber corresponding to the actual frequency of the radiofrequency signal as generated and transmitted by the impedance measurement system, the determined impedance corresponding to the impedance of the plasma processing chamber during generation of the plasma within the plasma processing chamber.

10. The method as recited in claim 9, further comprising: setting at least one variable impedance control device within the impedance control module to a prescribed setpoint; maintaining the prescribed setpoint while operating the impedance measurement system to generate and transmit the radiofrequency signal based on the frequency setpoint; and accessing a data storage to determine the impedance corresponding to the actual frequency of the radiofrequency signal generated and transmitted by the impedance measurement system, the data storage providing a correlation between the actual frequency of the radiofrequency signal generated and transmitted by the impedance measurement system and impedance as a function of the prescribed setpoint.

11. The method as recited in claim 10, wherein the at least one variable impedance control device includes at least one variable capacitor, or at least one variable inductor, or both at least one variable capacitor and at least one variable inductor, and wherein the prescribed setpoint is defined by a combination of respective capacitance settings of the at least one variable capacitor when present within the impedance control module and respective inductance settings of the at least one variable inductor when present within the impedance control module.

12. The method as recited in claim 11, further comprising: operating a system control module of the impedance measurement system to set the at least one variable impedance control device within the impedance control module to the prescribed setpoint; operating the system control module of the impedance measurement system to direct generation and transmission of the radiofrequency signal based on the frequency setpoint; and operating the system control module of the impedance measurement system to convey the determined impedance corresponding to the impedance of the plasma processing chamber during generation of the plasma within the plasma processing chamber.

13. The method as recited in claim 11, further comprising: (a) changing the prescribed setpoint of the impedance control module; (b) operating the impedance measurement system to generate and transmit the radiofrequency signal based on the frequency setpoint through the impedance control module to the radiofrequency signal supply line of the plasma processing chamber; (c) operating the impedance measurement system to determine the actual frequency of the radiofrequency signal generated and transmitted by the impedance measurement system with the prescribed setpoint as changed in operation (a); (d) operating the impedance measurement system to determine and record the impedance of the plasma processing chamber corresponding to the actual frequency of the radiofrequency signal as determined in operation (c); (e) repeating operations (a) through (d) a number of times necessary to obtain a statistically significant sample set of the determined impedance of the plasma processing chamber; and (f) determining an average impedance of the plasma processing chamber based on the statistically significant sample set of the determined impedance of the plasma processing chamber.

14. The method as recited in claim 13, further comprising: determining an impedance adjustment required to bring the average impedance of the plasma processing chamber as determined in operation (f) into alignment with a target impedance of the plasma processing chamber; and adjusting one or more settings of the primary matching circuit to implement the determined impedance adjustment.

15. The method as recited in claim 9, wherein the frequency setpoint is within a range extending from about 2 MHz to about 100 MHz, and wherein a power of the radiofrequency signal as generated and transmitted by the impedance measurement system is within a range extending from about 5 Watts (W) to about 1000 W.

16. A method for matching impedances of multiple plasma processing chambers, comprising:
(a) connecting an impedance measurement system to a radiofrequency signal supply line of a given plasma processing chamber;
(b) operating a primary radiofrequency signal generator of the given plasma processing chamber to transmit one or more radiofrequency signals through a primary matching circuit of the given plasma processing chamber and through the radiofrequency signal supply line of the given plasma processing chamber to generate a plasma within the given plasma processing chamber;
(c) operating the impedance measurement system to generate and transmit a radiofrequency signal based on a frequency setpoint through an impedance control module to the radiofrequency signal supply line of the given plasma processing chamber, the impedance measurement system operating separate and independent from the primary radiofrequency signal generator and the primary matching circuit of the given plasma processing chamber;
(d) operating the impedance measurement system to determine an actual frequency of the radiofrequency signal generated and transmitted by the impedance measurement system, wherein the actual frequency can be different than the frequency setpoint, wherein a difference between the actual frequency of the radiofrequency signal as generated by the radiofrequency signal generator and the frequency setpoint is partially dependent upon a setting of the impedance control module and is partially dependent upon the impedance of the given plasma processing chamber;
(e) operating the impedance measurement system to determine an impedance of the given plasma processing chamber corresponding to the actual frequency of the radiofrequency signal as generated and transmitted by the impedance measurement system, the determined impedance corresponding to the impedance of the given plasma processing chamber during generation of the plasma within the given plasma processing chamber;
(f) performing operations (a) through (e) on multiple plasma processing chambers to determine respective impedances of the multiple plasma processing chambers;
(g) for each of the multiple plasma processing chambers, determining a respective impedance adjustment required to bring the determined impedance of the plasma processing chamber into alignment with a target impedance.

17. The method as recited in claim 16, further comprising: for each of the multiple plasma processing chambers, changing one or more settings of the primary matching circuit of the plasma processing chamber to implement the impedance adjustment determined for the plasma processing chamber.

18. The method as recited in claim 16, wherein the target impedance is set equal to the determined impedance of one of the multiple plasma processing chambers.

19. The method as recited in claim 16, further comprising: for each of the multiple plasma processing chambers, repeating operations (c) through (e) for each of multiple prescribed setpoints of the impedance control module to determine a statistically significant sample set of impedance values for the plasma processing chamber; for each of the multiple plasma processing chambers, determining an average impedance of the plasma processing chamber based on the statistically significant sample set of impedance values determined for the plasma processing chamber; and for each of the multiple plasma processing chambers, using the average impedance of the plasma processing chamber as the determined impedance of the plasma processing chamber in operation (g).

* * * * *